(12) United States Patent
Liu et al.

(10) Patent No.: US 8,551,867 B2
(45) Date of Patent: Oct. 8, 2013

(54) MESA EDGE SHIELDING TRENCH SCHOTTKY RECTIFIER AND METHOD OF MANUFACTURE THEREOF

(75) Inventors: Wei Liu, Suzhou (CN); Fan Wang, Suzhou (CN); Xiaozhong Sun, Suzhou (CN)

(73) Assignee: Suzhou Silikron Semicoductor Co., Ltd, Suzhou, Jiangsu Province (CN)

( * ) Notice: Subject to any disclaimer, the term of this patent is extended or adjusted under 35 U.S.C. 154(b) by 236 days.

(21) Appl. No.: 12/982,714

(22) Filed: Dec. 30, 2010

(65) Prior Publication Data

US 2012/0168893 A1 Jul. 5, 2012

(51) Int. Cl.
*H01L 29/47* (2006.01)
*H01L 21/20* (2006.01)

(52) U.S. Cl.
USPC ............................ 438/478; 438/597; 257/471

(58) Field of Classification Search
CPC ................................ H01L 29/47; H01L 21/20
See application file for complete search history.

(56) References Cited

U.S. PATENT DOCUMENTS

2009/0309181 A1 * 12/2009 Hsieh ........................... 257/471

FOREIGN PATENT DOCUMENTS

CN 101901807 * 12/2010

* cited by examiner

Primary Examiner — Walter H Swanson

(57) ABSTRACT

A mesa edge shielding trench Schottky rectifier includes a semiconductor substrate; an epitaxial layer grown on the first surface of the semiconductor substrate; a plurality of trenches spaced from each other and extended into the epitaxial layer, wherein an epitaxial region between two adjacent trenches forms the silicon mesa; a polysilicon region, having a T-shape, is separated from an inner wall of each of the trenches and a top surface of the epitaxial layer by an oxide layer, wherein a width of the top surface of the polysilicon region is bigger than an open size of each of the trenches; an anode electrode, deposited on an entire structure, forming an ohmic contact on the top surface of the polysilicon region and a Schottky contact on an exposed surface of the epitaxial layer; and a cathode electrode, deposited on the second surface of the semiconductor substrate, forming an ohmic contact thereon.

8 Claims, 8 Drawing Sheets

MESA EDGE SHIELDING TRENCH SCHOTTKY RECTIFIER AND METHOD OF MANUFACTURE THEREOF

BACKGROUND OF THE PRESENT INVENTION

1. Field of Invention

The present invention relates to semiconductor devices, and more particularly to a trench Schottky rectifier with semiconductor mesa edge shielding, and its method of manufacture.

2. Description of Related Arts

Schottky rectifiers are widely used in power supply systems, and their primary advantage is the very low forward voltage drop. However, for some applications, Schottky rectifiers are limited by their relatively high reverse biased leakage current, or the low reverse blocking voltage, compared to conventional PN junction rectifiers. The forward voltage drop and reverse biased leakage current are primarily determined by the metal energy barrier height of material deposited on the silicon. A tradeoff between forward voltage drop and reverse biased leakage current has to be made by choosing different barrier metals.

One attempt to minimize the reverse biased leakage current and forward voltage drop simultaneously is disclosed in U.S. Pat. No. 5,365,102 by Manoj Mehrotra and Bantval J. Baliga, and entitled to be "Schottky Barrier Rectifier with MOS Trench". The disclosure is hereby incorporated by reference. A cross-sectional representation of one embodiment of the referenced disclosure is illustrated in FIG. 1. In this figure, the rectifier 10 includes a semiconductor substrate 12 of the first conductivity type, typically N-type conductivity, having a first face 12a and a second opposing face 12b. The substrate 12 preferably comprises a relatively highly doped cathode region 12c (shown as N+) adjacent to the first face 12a. A drift region 12d of first conductivity type (shown as N) preferably extends from the cathode region 12c to the second face 12b. Accordingly, the doping concentration of the cathode region is preferably greater than the drift region. A mesa 14 having a cross-sectional width "Wm", defined by opposing sides 14a and 14b, is preferably formed in the drift region 12d. The mesa can be of stripe, rectangular, cylindrical or other similar geometry. Insulating regions 16a and 16b (shown as $SiO_2$) are also provided on the mesa sides. The rectifier also includes an anode electrode 18 on the insulating regions 16a, 16b. The anode electrode 18 forms a Schottky rectifying contact with the mesa 14. A cathode electrode 20 is provided adjacent to the cathode region 12c at the first face 12a. The cathode electrode 20 ohmically contacts the cathode region 12c.

By introducing a plurality of trenches into the silicon and the anode metal within each of the trenches that is separated by a layer of dielectric material, the electrical field intensity at the metal/silicon Schottky barrier is reduced under the reverse potential, which leads to the lower reverse biased leakage current compared with the conventional planar Schottky rectifiers using the same kind of silicon and metal material.

However, the rectifier shown in FIG. 1 has some disadvantages as follows.

(1) The edge of the mesa directly contacting the metal has a sharp point. The corona discharge effect at this point can lead to the high reverse biased leakage current.

(2) The dielectric layer near the mesa edge on the trench sidewalls could be damaged during the dielectric-layer-on-mesa-top (hard mask) removing processes. The direct contact of the anode metal and the mesa sidewall can lead to the high reverse biased leakage current.

(3) The step coverage of the metal is limited. The voids within the trenches posting a high depth-to-width ratio trench metal filling could degrade the performance and reliability of the trench Schottky rectifier.

SUMMARY OF THE PRESENT INVENTION

An object of the present invention is to provide a trench Schottky rectifier with mesa edge shielding, wherein the mesa edge is shielded and protected by an oxide layer, not contact with the metal, thus reducing the corona discharge effect induced reverse biased leakage current.

Another object of the present invention is to provide a trench Schottky rectifier with mesa edge shielding comprising a T-shaped conductive polysilicon region, wherein the coronal upper portion thereof is higher than the mesa and overlaps the mesa, wherein the mesa edge is shielded and protected by an oxide layer and a conductive polysilicon to layer, thus reducing the corona discharge effect and oxide layer damage induced reverse biased leakage current.

Another object of the present invention is to provide a trench Schottky rectifier with mesa edge shielding comprising a pair of dielectric spacer regions on the sidewalls of the coronal upper portion of the polysilicon region, respectively, wherein the oxide layer is covered and protected by the spacer, thus reducing the oxide layer damage induced reverse biased leakage current.

Another object of the present invention is to provide a trench Schottky rectifier with mesa edge shielding, wherein the trench is filled by polysilicon, which has good step coverage, thus giving a high device performance and reliability.

Accordingly, in order to accomplish the above objects, the present invention provides a mesa edge shielding trench Schottky rectifier, comprising:

a semiconductor substrate having a first surface and a second surface opposite to the first surface;

an epitaxial layer grown on the first surface of the semiconductor substrate;

a plurality of trenches spaced from each other and extended into the epitaxial layer, wherein an epitaxial region between two adjacent trenches forms a silicon mesa;

a polysilicon region, having a T-shape, that is separated from an inner wall of each of the trenches and a top surface of the epitaxial layer by a layer of dielectric material, wherein a coronal upper portion of the polysilicon region is higher than the epitaxial layer, a width of the coronal upper portion of the polysilicon region is bigger than an open size of each of the trenches;

an anode electrode, deposited on an entire structure, forming an ohmic contact on a top surface of the polysilicon region and a Schottky contact on an exposed surface of the epitaxial layer; and a cathode electrode, deposited on the second surface of the semiconductor substrate, forming an ohmic contact thereon.

Also, the present invention provides a method of manufacturing a mesa edge shielding trench Schottky rectifier, comprising the steps of:

(A) forming an epitaxial layer grown on a first surface of a semiconductor substrate;

(B) forming a plurality of trenches spaced from each other and extended into the epitaxial layer, wherein an epitaxial region between two adjacent trenches forms a silicon mesa;

(C) forming a polysilicon region, having a T-shape, that is separated from an inner wall of each of the trenches and a top surface of the epitaxial layer by a layer of dielectric material, wherein a coronal upper portion of the polysilicon region is higher than the epitaxial layer, a width of the coronal upper portion of the polysilicon region is bigger than an open size of each of the trenches;

(D) forming an anode electrode by depositing a layer of metal on an entire structure, thus forming an ohmic contact on a top surface of the polysilicon region and a Schottky contact on an exposed surface of the epitaxial layer; and (E) forming a cathode electrode by depositing a layer of metal on the second surface of the semiconductor substrate, thus forming an ohmic contact thereon.

These and other objectives, features, and advantages of the present invention will become apparent from the following detailed description, the accompanying drawings, and the appended claims.

DETAILED DESCRIPTION OF THE PREFERRED EMBODIMENT

Figure 1:
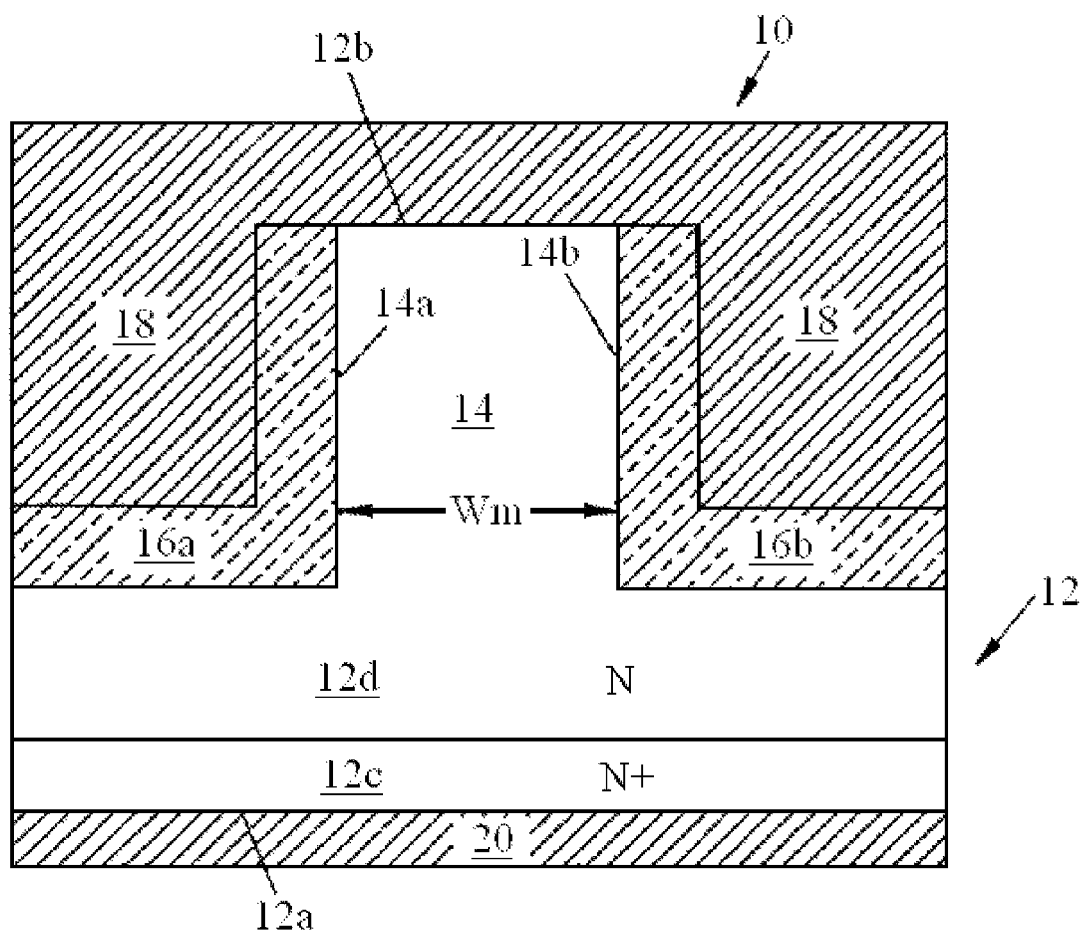
FIG. 1 illustrates a cross-sectional view of a prior art rectifier, according to one embodiment of U.S. Pat. No. 5,365,102.
Figure 2:
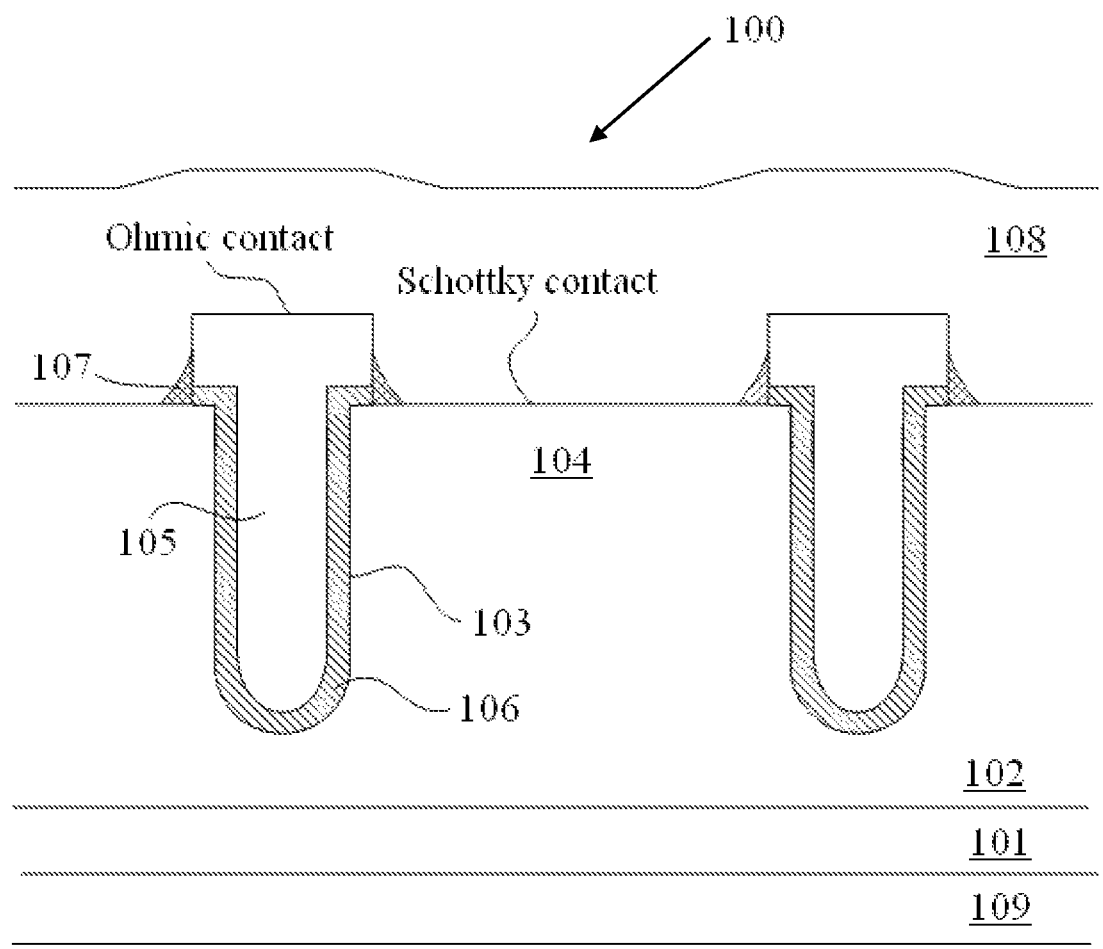
FIG. 2 is a cross-sectional view of a mesa edge shielding trench Schottky rectifier according to a first preferred embodiment of the present invention.

Referring to FIG. 2 of the drawings, a mesa edge shielding trench Schottky rectifier according to a first preferred embodiment of the present invention is illustrated. The trench Schottky rectifier 100 is supported on an N+ doped substrate 101 formed with an N-doped epitaxial layer 102.

The trench Schottky rectifier 100 comprises a plurality of trenches 103 spaced from each other and extended into the N-doped epitaxial layer 102. Accordingly, an N-doped epitaxial region between two adjacent trenches 103 forms a silicon mesa 104. An N+ doped polysilicon region 105, having a T-shape, is separated from an inner wall of each of the trenches 103 and a top surface of the N-doped epitaxial layer 102 by an oxide layer 106, wherein a coronal upper portion of the N+ doped polysilicon 105 is higher than the N-doped epitaxial layer 102, a width of the coronal upper portion of the N+ doped polysilicon 105 is bigger than an open size of each of the trenches 103. A pair of dielectric spacer regions 107 are formed on the N-doped epitaxial layer 102, each of the pair of dielectric spacer regions 107 covers a sidewall of the oxide layer 106 and a part of a sidewall of the coronal upper portion of the N+ doped polysilicon region 105.

An anode electrode 108, deposited on the entire structure, forms an ohmic contact on the top surface of the N+ doped polysilicon region 105 and a Schottky contact on an exposed surface of the N-doped epitaxial layer 102. A cathode electrode 109, deposited on a rear surface of the N+ doped substrate 101, forms an ohmic contact thereon.

It is obvious that the mesa edge is shielded and protected by an oxide layer and a conductive polysilicon layer, not contact with the metal. Each of the trenches is filled with the conductive polysilicon. The cross sectional profile of the conductive polysilicon region is T-shaped. The coronal upper portion of the polysilicon region 105 is higher than the mesa and overlaps the mesa. There are two dielectric spacer regions on the two sidewalls of the coronal upper portion of the polysilicon region 105, respectively. A Schottky contact is formed on the exposed top surface of the mesa. An Ohmic contact is formed on the exposed surface of the conductive polysilicon.

Figure 3:
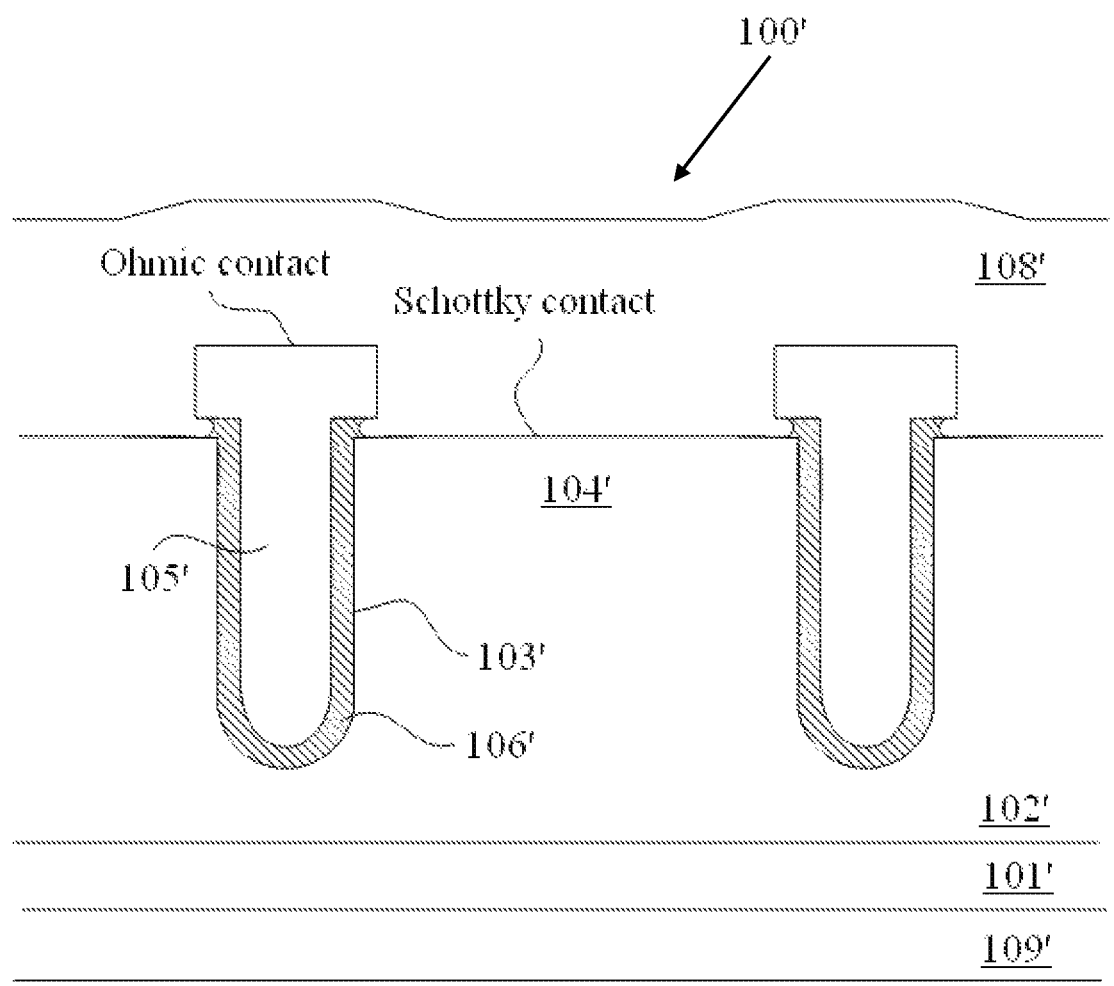
FIG. 3 is a cross-sectional view of a mesa edge shielding trench Schottky rectifier according to a second preferred embodiment of the present invention.

Referring to FIG. 3, a mesa edge shielding trench Schottky rectifier according to a second preferred embodiment of the present invention is illustrated, compared with FIG. 2, no dielectric spacer is formed on the sidewall of the coronal upper portion of the "T".

Similarly, the trench Schottky rectifier 100' is supported on an N+ doped substrate 101' formed with an N-doped epitaxial layer 102'.

The trench Schottky rectifier 100' comprises a plurality of trenches 103' spaced from each other and extended into the N-doped epitaxial layer 102'. Accordingly, an N-doped epitaxial region between two adjacent trenches 103' forms a silicon mesa 104'. An N+ doped polysilicon region 105', having a T-shape, is separated from an inner wall of each of the trenches 103' and a top surface of the N-doped epitaxial layer 102' by an oxide layer 106', wherein a coronal upper portion of the N+ doped polysilicon 105' is higher than the N-doped epitaxial layer 102', a width of the coronal upper portion of the N+ doped polysilicon 105' is bigger than an open size of each of the trenches 103'.

An anode electrode 108', deposited on the entire structure, forms an ohmic contact on the top surface of the N+ doped polysilicon region 105' and a Schottky contact on an exposed surface of the N-doped epitaxial layer 102'. A cathode electrode 109', deposited on a rear surface of the N+ doped substrate 101', forms an ohmic contact thereon.

Accordingly, the present invention has some advantages as below.

(1) Corona discharge effect is eliminated, for the edge of the mesa is shielded by the oxide layer and the polysilicon layer. Therefore, the reverse biased leakage current can be reduced.

(2) The oxide layer on the trench (or the mesa) sidewall is well protected from the fabrication processes' induced damage, so reverse biased leakage current can be reduced.

(3) The mesa shielding structure and the dielectric spacer is formed using the self-alignment technology, no photo process is involved.

(4) The step coverage of the polysilicon is much better than that of the metal, so it can satisfy different depth-to-width ratio trenches design.

That is to say, the device performance and manufacturability are both improved.

Figure 4:
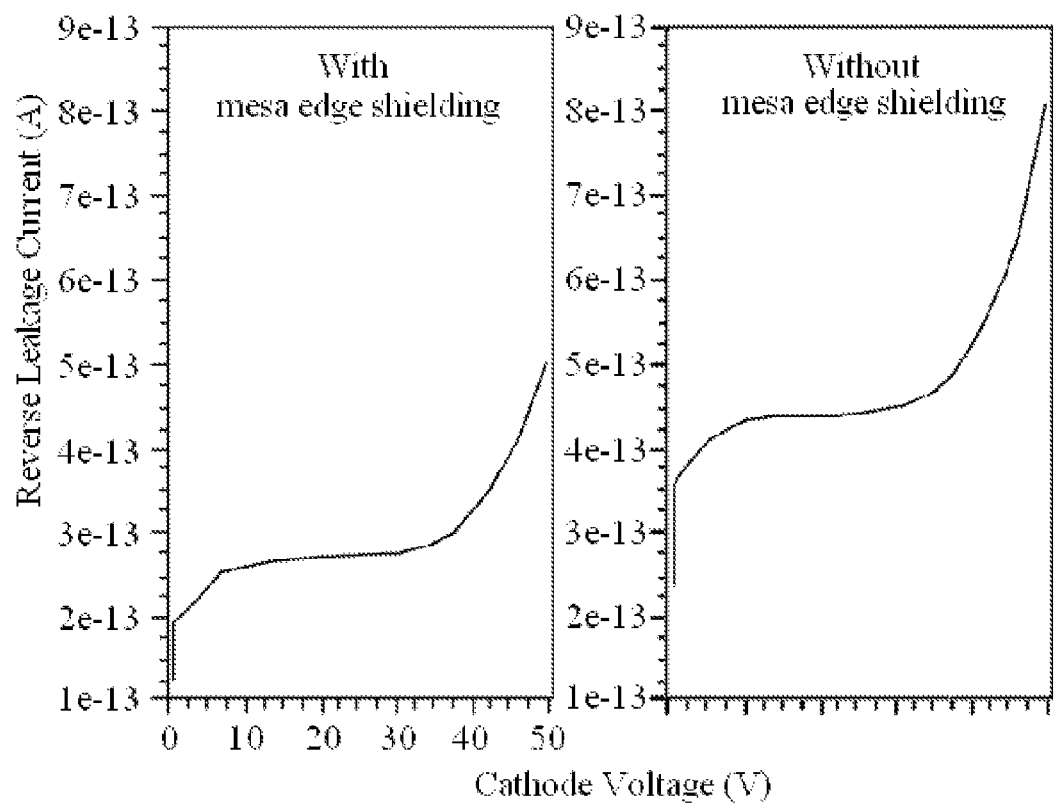
FIG. 4 is a simulated "reverse biased leakage current vs. reverse bias" curve of a trench Schottky rectifier single cell.

FIG. 4 is a simulated "reverse biased leakage current vs. reverse bias" curve of a trench Schottky rectifier single cell. The structure with mesa edge shielding gives 38% lower leakage current at 30V reverse bias, comparing with the structure without mesa edge shielding.

Figure 5A:
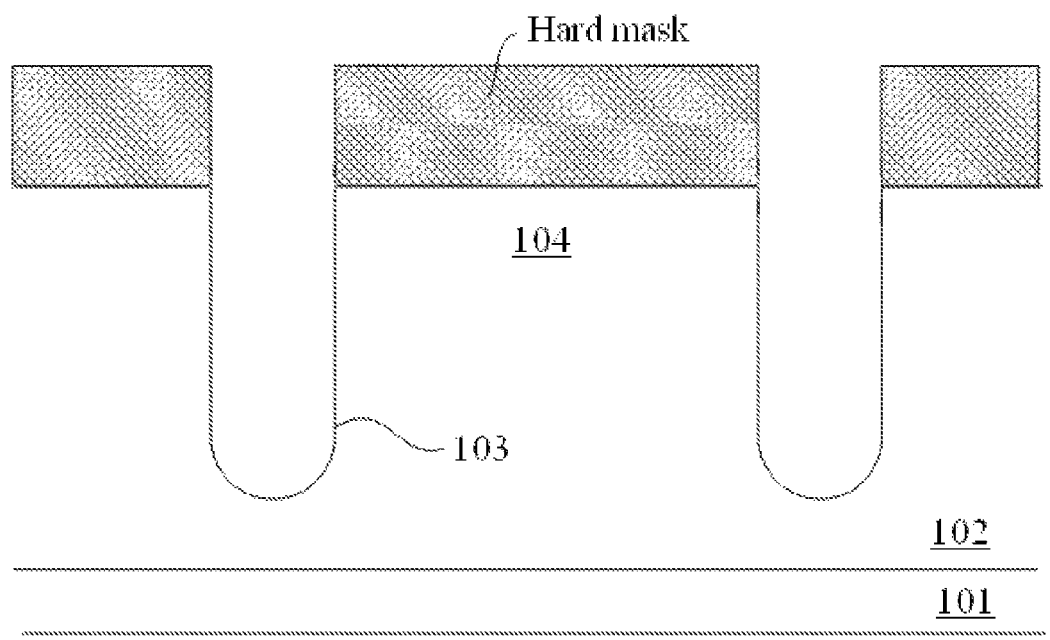
FIGS. 5A to 5G for a series of side cross sectional views to illustrate the fabrication steps of a mesa edge shielding trench Schottky rectifier as shown in FIG. 2.

Referring to FIGS. 5A to 5G for a series of side cross sectional views to illustrate the fabrication steps of a mesa edge shielding trench Schottky rectifier as shown in FIG. 2. In FIG. 5A, an N+ doped substrate 101 is prepared as a cathode region of the trench Schottky rectifier, and an N-doped epitaxial layer 102 is grown on the N+ doped substrate 101. A dielectric layer is formed on the N-doped epitaxial layer. The dielectric layer is composed of oxide, or nitride, or multiple layers of oxide and nitride. A photoresist masking process is used to form mask portions (not shown), which define the location of the trenches 103. The hard mask dielectric material is removed through the openings between the mask portions by dry etch. Then mask portions are removed. Using the patterned dielectric layer as hard mask, a plurality of trenches 103 spaced from each other are formed into the N-doped epitaxial layer 102 by dry etch. The N-doped epitaxial region beneath the dielectric hard mask between two adjacent trenches 103 forms a silicon mesa 104.

Figure 5B:
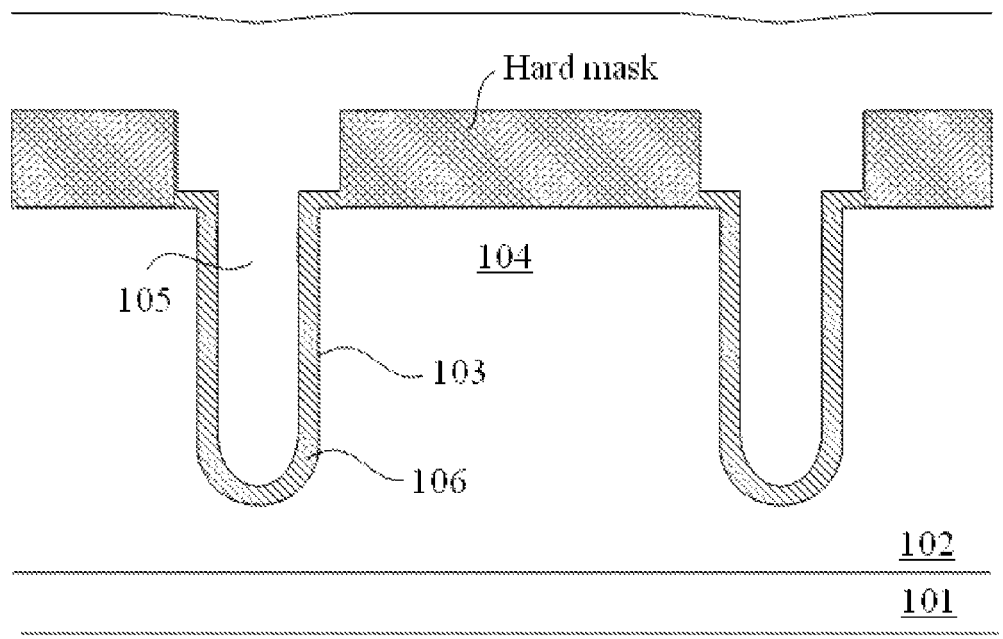

In FIG. 5B, a layer of hard mask dielectric material is removed by isotropic wet etch. Therefore, an open size of the hard mask is bigger than that of each of the trenches 103. And a thickness of the hard mask dielectric layer is also reduced a little. An oxide layer 106 is formed over a surface of the exposed N-doped epitaxial regions by thermal oxidation. An N+ doped polysilicon is deposited on the entire structure. Accordingly, the trenches 103 and the openings of the hard mask are fulfilled.

Figure 5C:
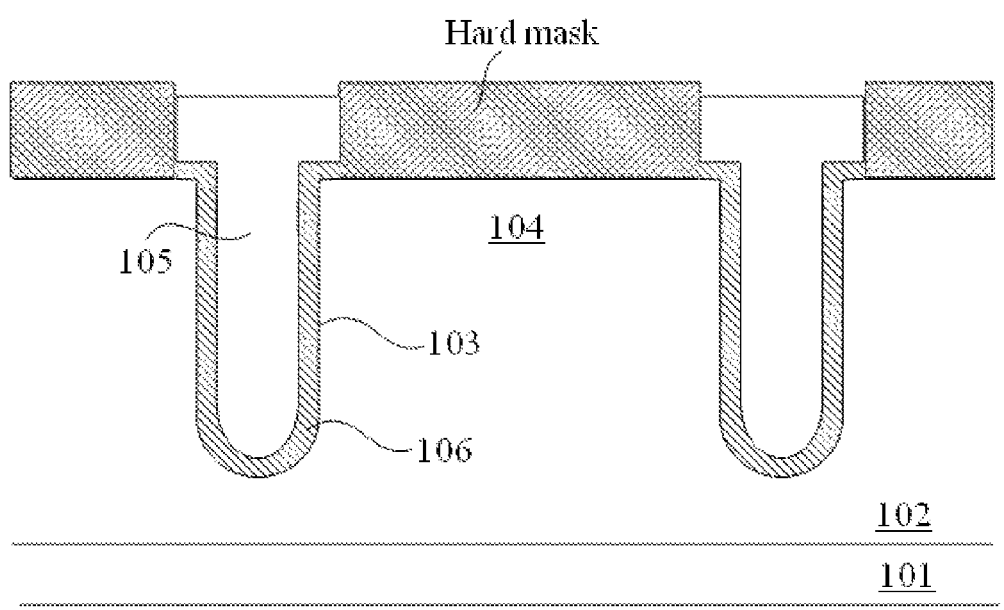

In FIG. 5C, the polysilicon on the hard mask layer is removed by a selective dry etch. The polysilicon inside the trenches 103 and the openings of the hard mask is preserved. Then the cross section profile of the remained polysilicon is T-shaped.

Figure 5D:
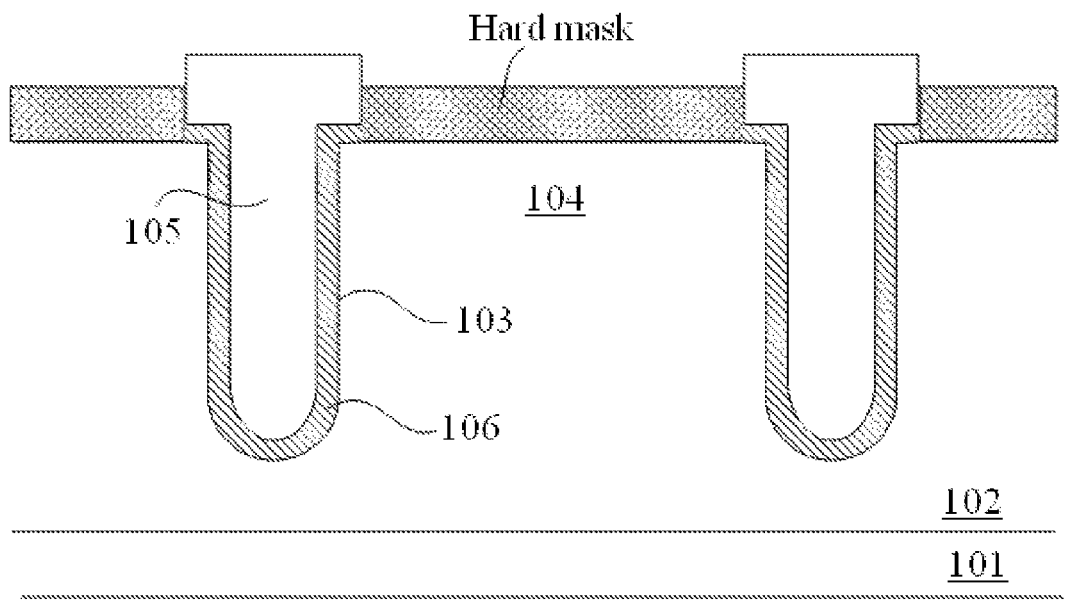

In FIG. 5D, a part of the hard mask material is removed by a selective dry etch and forms a plurality of polysilicon mesas. The top surface of the remained hard mask layer is lower than that of the polysilicon, and higher than that of the oxide layer.

Figure 5E:
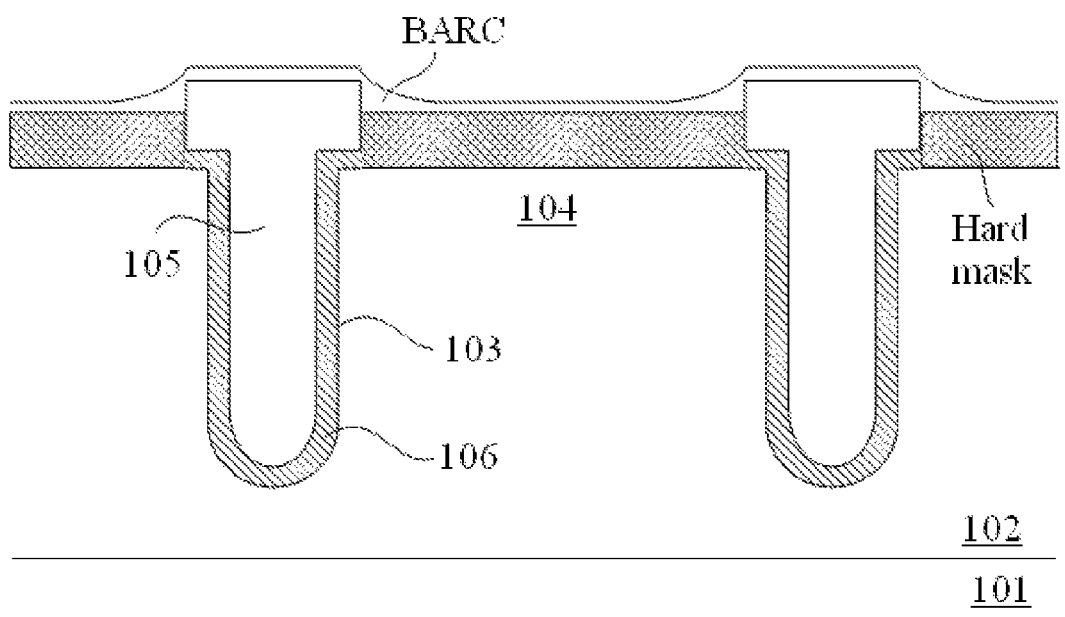

In FIG. 5E, a BARC (bottom anti-reflective coating) layer is coated on the entire structure by spin coating process. Because of the topography, more BARC materials are piled at the foot of the polysilicon mesa.

Figure 5F:
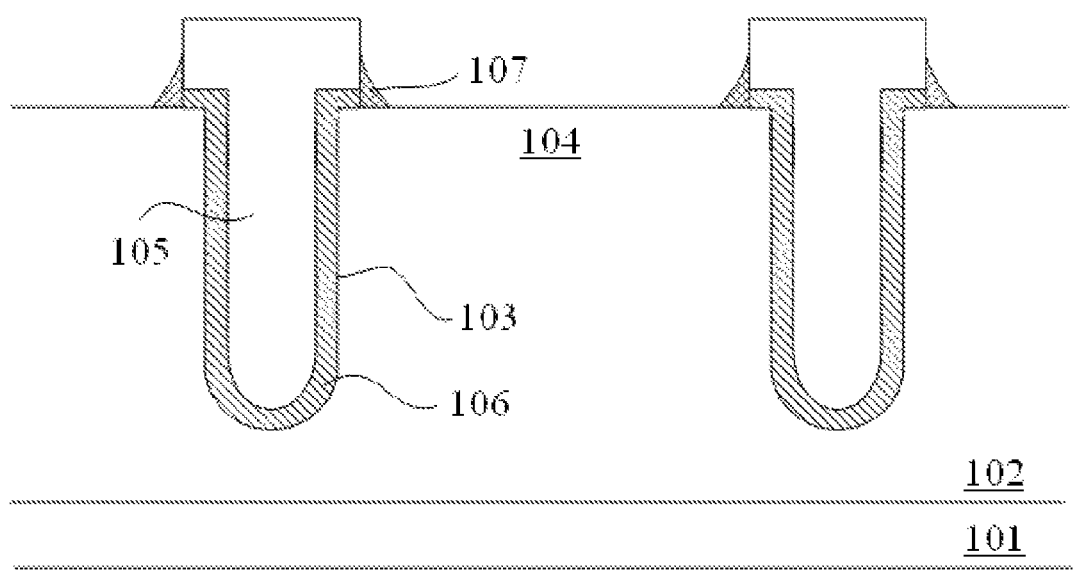

In FIG. 5F, a dry etch is performed to remove the BARC and hard mask dielectric material with the same etch remove rate, but keep the polysilicon un-damaged (much smaller polysilicon etch remove rate), till the top surface of the N-EPI silicon mesa is exposed. The topography of the BARC is transferred to the hard mask layer, leading to a dielectric spacer structure. The dielectric spacer regions 107 cover the sidewall of the oxide layer and a part of the sidewall of polysilicon mesa.

Figure 5G:
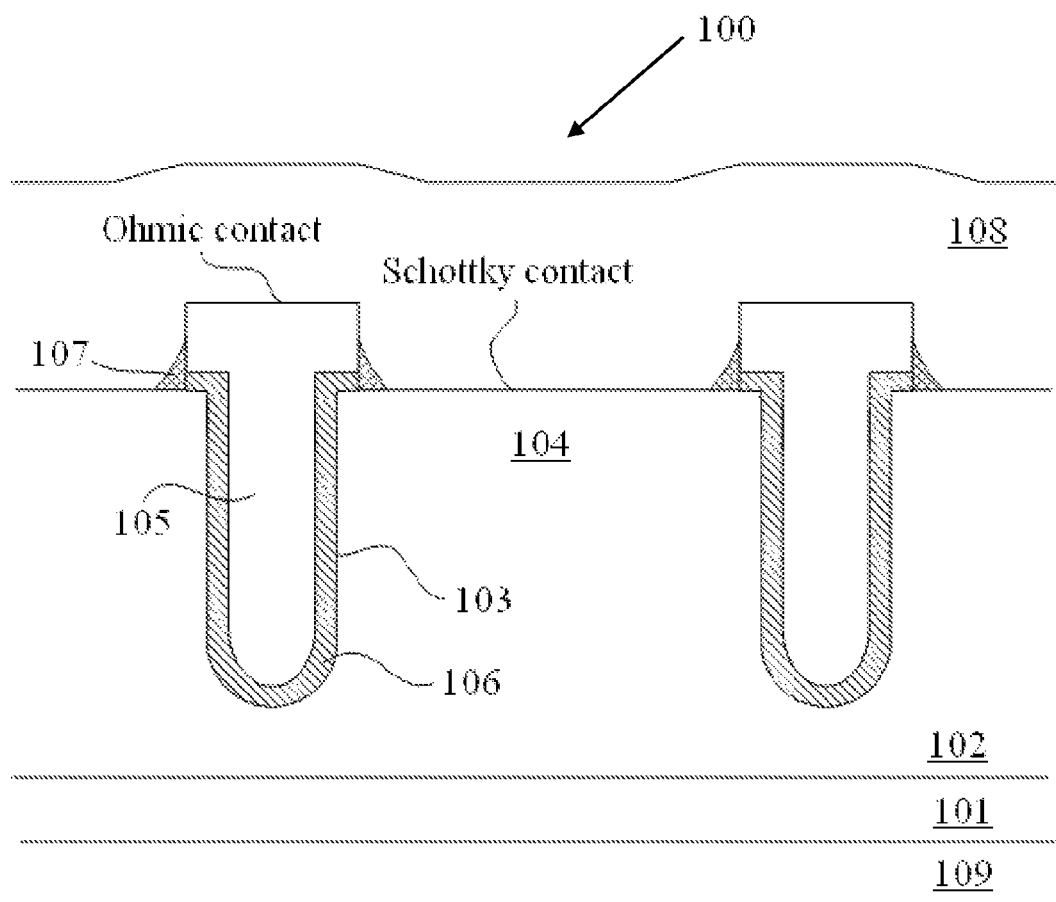

In FIG. 5G, a metal layer is deposited on the entire structure, post a thermal process, forms a Schottky barrier contact on the exposed surface of the N-EPI silicon mesa, and forms an Ohmic contact on the exposed surface of the polysilicon. The metal layer forms the anode electrode 108. Then, a metal layer is deposited on the rear surface of the N+ doped substrate, forms an Ohmic contact. The metal layer forms the cathode electrode 109.

Figure 6A:
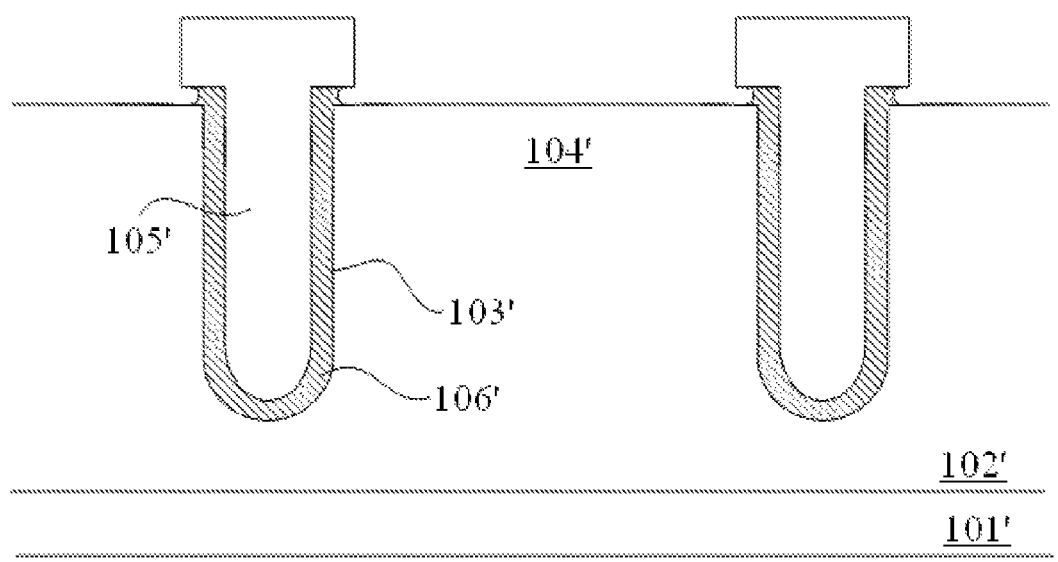
FIGS. 6A and 6B are side cross sectional views to illustrate the fabrication steps of a mesa edge shielding trench Schottky rectifier as shown in FIG. 3.
Figure 6B:
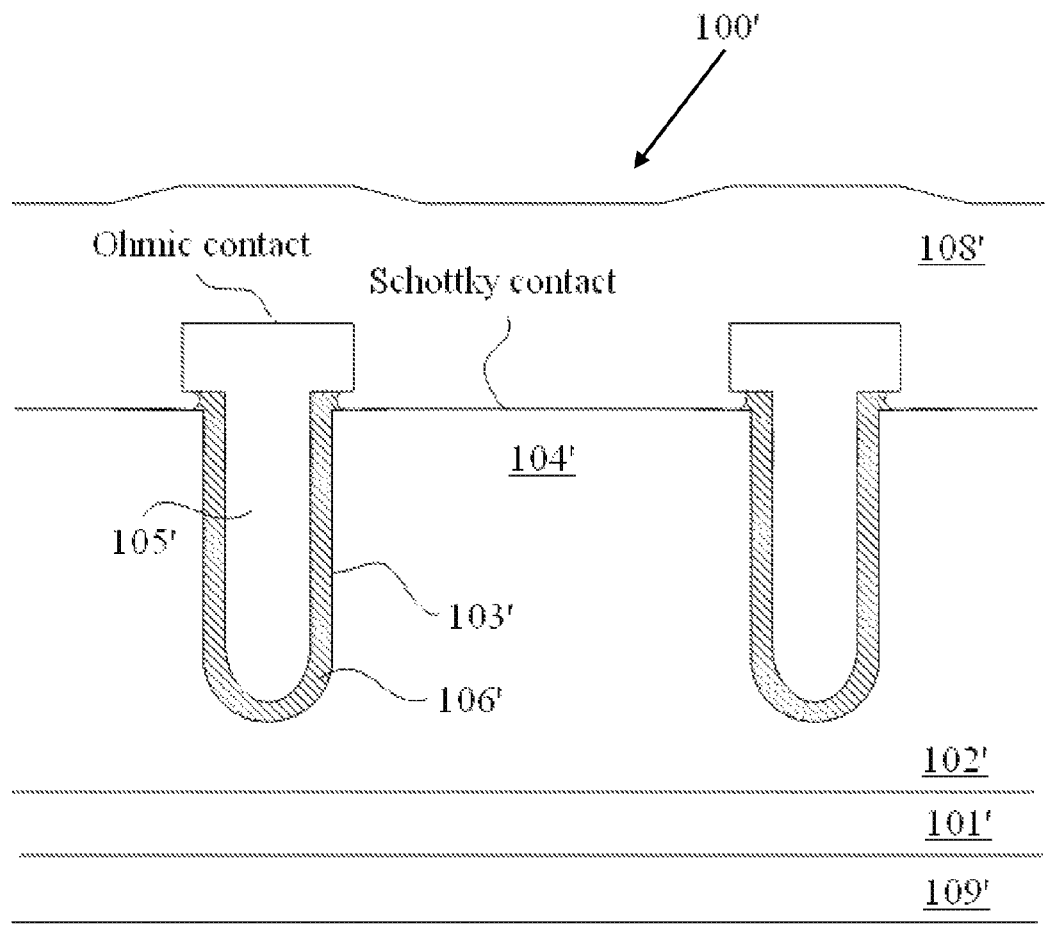

FIGS. 6A and 6B are side cross sectional views to illustrate the fabrication steps of a mesa edge shielding trench Schottky rectifier as shown in FIG. 3. After the step shown in FIG. 5C, a wet etch is performed to selectively remove the hard mask dielectric material. Metal layer is deposited on the entire structure, post a thermal process, forms Schottky barrier contact on the exposed surface of N-EPI silicon mesa, forms Ohmic contact on the exposed surface of polysilicon. The metal layer forms the anode electrode. Metal layer is deposited on the rear surface of N+ doped substrate, forms Ohmic contact. The metal layer forms the cathode electrode.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A method of manufacturing a mesa edge shielding trench Schottky rectifier, comprising the steps of:
   (A) forming an epitaxial layer grown on a first surface of a semiconductor substrate;
   (B) forming a plurality of trenches spaced from each other and extended into the epitaxial layer, wherein an epitaxial region between two adjacent trenches forms a silicon mesa;
   (C) forming a polysilicon region, having a T-shape, that is separated from an inner wall of each of the trenches and a top surface of the epitaxial layer by a layer of dielectric material, wherein a coronal upper portion of the polysilicon region is higher than the epitaxial layer, a width of the coronal upper portion of the polysilicon region is bigger than a width of each of the trenches;
   (D) forming an anode electrode by depositing a layer of metal on an entire structure, thus forming an ohmic contact on a top surface of the polysilicon region and a Schottky contact on an exposed surface of the epitaxial layer;
   (E) forming a cathode electrode by depositing a layer of metal on an opposite surface of the semiconductor substrate, thus forming an ohmic contact thereon; and
   (F) forming a pair of dielectric spacer regions on the epitaxial layer, comprising:
      (F1) after step (C), forming a plurality of polysilicon mesas by removing a part of a hard mask material, wherein a top surface of a remained hard mask layer is lower than that of the polysilicon region, and higher than that of the layer of dielectric material;
      (F2) coating a BARC (bottom anti-reflective coating) layer on an entire structure after step (F1), wherein more BARC material is piled at a foot of each of the polysilicon mesas because of the topography; and
      (F3) removing the BARC layer and a part of the remained hard mask layer with a same etch remove rate, but keeping a polysilicon un-damaged till a top surface of the silicon mesa is exposed,
   wherein each of the pair of dielectric spacer regions covers a sidewall of the layer of dielectric material.

2. The method, as recited in claim 1, wherein each of the pair of dielectric spacer regions covers a part of a sidewall of the coronal upper portion of the polysilicon region.

3. The method, as recited in claim 1, wherein the trenches are formed by using a patterned dielectric layer as a hard mask, wherein forming the polysilicon region comprises:
   (C1) forming an opening penetrating through the hard mask and corresponding to each of the trenches by removing a part of a hard mask dielectric material, wherein a width of the opening is bigger than that of each of the trenches;
   (C2) forming the layer of dielectric material on an exposed surface of the epitaxial region and along an inner wall of each of the trenches; and
   (C3) filling the trenches and the openings of the hard mask with a polysilicon.

4. The method, as recited in claim 2, wherein the trenches are formed by using a patterned dielectric layer as a hard mask, wherein forming the polysilicon region comprises:
   (C1) forming an opening penetrating through the hard mask and corresponding to each of the trenches by removing a part of a hard mask dielectric material, wherein a width of the opening is bigger than that of each of the trenches;

(C2) forming the layer of dielectric material on an exposed surface of the epitaxial region and along an inner wall of each of the trenches; and (C3) filling the trenches and the openings of the hard mask with a polysilicon.

5. The method, as recited in claim 1, wherein a dope concentration of the semiconductor substrate is higher than that of the epitaxial layer.

6. The method, as recited in claim 2, wherein a dope concentration of the semiconductor substrate is higher than that of the epitaxial layer.

7. The method, as recited in claim 3, wherein a dope concentration of the semiconductor substrate is higher than that of the epitaxial layer.

8. The method, as recited in claim 4, wherein a dope concentration of the semiconductor substrate is higher than that of the epitaxial layer.

* * * * *